United States Patent [19]

Naitoh

[11] Patent Number: 5,230,060
[45] Date of Patent: Jul. 20, 1993

[54] SPEECH CODER AND DECODER FOR ADAPTIVE DELTA MODULATION CODING SYSTEM

[75] Inventor: Masashi Naitoh, Sendai, Japan

[73] Assignee: Kokusai Electric Co., Ltd., Tokyo, Japan

[21] Appl. No.: 659,879

[22] Filed: Feb. 22, 1991

[51] Int. Cl.$^5$ .............................................. G10L 9/00
[52] U.S. Cl. ..................................... 395/2; 375/27; 381/31
[58] Field of Search ................. 395/2; 381/29–31, 381/34–36; 375/27

[56] References Cited

U.S. PATENT DOCUMENTS 4,592,070  5/1986  Chow et al. .................... 375/27
4,630,300 12/1986  Kang et al. ..................... 395/2
4,751,736  6/1988  Gupta et al. .................... 395/2

OTHER PUBLICATIONS

Rabiner et al, Digital Processing of Speech Signals, 1978 by Bell Lab, Inc, pp. 207–209 and 228–232.
Bellanger, Digital Processing of Signals, 1984, by John Wiley & Sons, Ltd., pp. 354–357.

Primary Examiner—David D. Knepper
Attorney, Agent, or Firm—Emmanuel J. Lobato; Robert E. Burns

[57] ABSTRACT

Deterioration of speech quality due to coding errors during transmission is reduced by suppressing high changes in amplitude. High changes in amplitude are detected by comparing an amplified step size with a decoded output signal. Step size is amplified (by a range of 2–4) and compared to a delayed, decoded output signal. The delayed, decoded output is attenuated (by a range of 0.8–0.99) and the comparison controls a selection between two signals: the amplified step size and the attenuated output. The attenuated output is selected if the delayed output is greater than the amplified step size; otherwise, the amplified step size is selected. The selected signal serves as a prediction signal.

6 Claims, 4 Drawing Sheets

SPEECH CODER AND DECODER FOR ADAPTIVE DELTA MODULATION CODING SYSTEM

BACKGROUND OF THE INVENTION

The present invention relates to a speech waveform coding system which is one of speech signal coding systems and, more particularly, to a speech coder and a speech decoder for use in an adaptive delta modulation (hereinafter abbreviated to ADM) coding system.

The ADM coding system is employed for digital mobile radio communication and the like because of robustness to coding errors during transmission and advantages of easy synchronization, small size and low power consumption over other coding systems.

In the conventional system, however, when a transmitted signal is erroneously changed from a state "0" to a state "1", deterioration of the speech quality is particularly serious.

SUMMARY OF THE INVENTION

It is an object of the present invention to provide a speech coder and a speech decoder to be used in the ADM coding system which are adapted to suppress the deterioration of the speech quality caused by the above-mentioned increased amplitude of the output signal when a coding error occurs during transmission.

The present invention makes a great feature of a construction in which the signal $Y(nT)$ decoded bit by bit and a k-fold (where k is set to an arbitrary value in the range of between 2 and 4) value of the step width $\Delta(nT)$ are compared with each other, and the output signal $Y(nT)$ is attenuated when it is greater than a value of $\Delta(nT)k$.

In accordance with the present invention, there is provided a speech coder for generating a coded outputs of an analog input by the use of an adaptive delta modulation coding system, which codes the result of subtraction between an input signal and a one-bit preceding prediction signal for each sampling period, characterized by:

a comparator/attenuator which receives, as inputs thereto, a signal obtained by delaying, for a one-bit period, a prediction signal obtained by quantizing and adding said analog input signal and a step width output of a step width adjuster into which a coded output of said coder is input, compares, bit by bit, the absolute value of the amplitude of said one-bit delayed signal and the amplitude of a signal obtained by making said step width output k-fold (where k=2 to 4) and, when the former exceeds the latter, makes the amplitude of said prediction signal P-fold (where $0.8 < P < 0.99$) and outputs it as said one-bit preceding prediction signal.

A speech decoder which receives and decodes a transmitted digital signal to produce an analog signal by the use of an adaptive delta modulating coding system, characterized by:

a comparator/attenuator which receives, as inputs thereto, a prediction signal obtained by delaying a decoded output signal for a one-bit period and a step width output of a step width adjuster into which said transmitted signal is input, compares, bit by bit, the absolute value of said one-bit delayed prediction signal and the amplitude of a signal obtained by making said step width output k-fold (where k=2 to 4) and, when the former exceeds the latter, makes the amplitude of said decoded output signal P-fold (where $0.8 < P < 0.99$) to provide said one-bit delayed prediction signal.

THE BRIEF DESCRIPTION OF THE DRAWINGS

The present invention will be described in detail below in comparison with prior art with reference to the accompanying drawings, in which.

DETAILED DESCRIPTION

Figure 4:
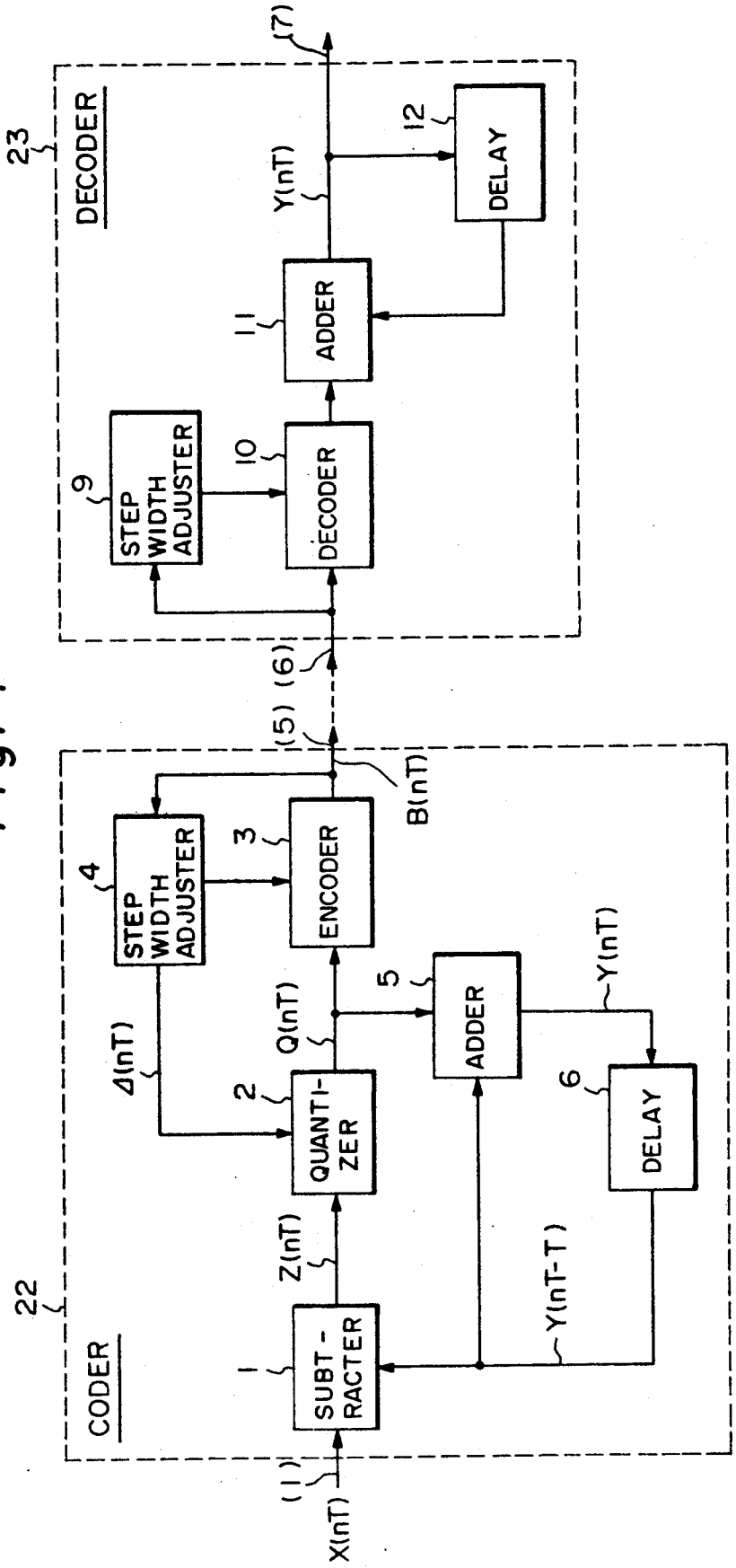
FIG. 4 is a block diagram showing a conventional circuit construction.

To make differences between prior art and the present invention clear, a coder 22 and a decoder 23 for use in a conventional ADM coding system will first be described using FIG. 4. In FIG. 4, reference numeral (1) indicates an analog input signal to the coder, (5) a digital output signal coded by the coder 22, (6) a digital input signal to the decoder 23 and (7) an analog output signal decoded by the decoder 23. In the coder 22, reference numeral 1 denotes a subtractor (DEC), 2 a quantizer (QTZ), 3 encoder (DGT), 4 a step width adjuster (STP), 5 an adder (ADD) and 6 a delay element (D). The digital output signal (5) coded by the coder 22 is provided onto a radio or wire transmission line at a transmission rate of, for example, 16 kbps. In the decoder 23 at the receiving side, reference numeral 10 denotes a decoder (DET), 9 a step width adjuster (STP), 11 an adder (ADD) and 12 a delay element (D). By reversing the operation of the coder 22, the digital input signal to the decoder 23 is decoded into an analog form for outputting as the analog output signal (7). Incidentally, a binary number corresponding to the number of quantized bits is used as each piece of data except the transmitted and received digital data (5) and (6).

Figure 2:
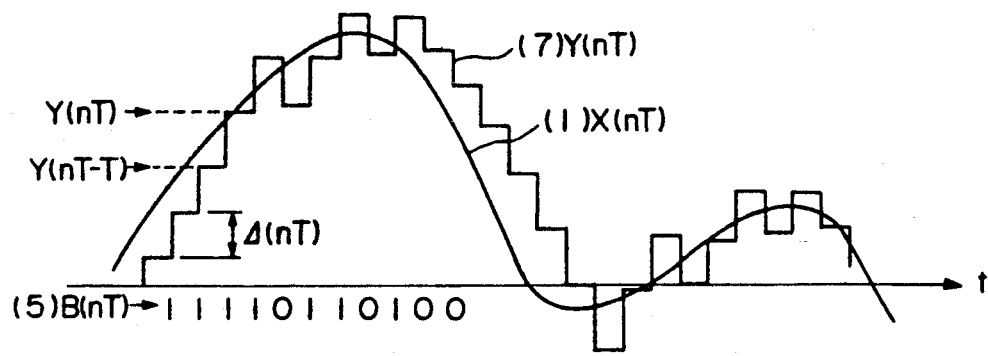
FIG. 2 is a waveform diagram showing its principles of operation.

FIG. 2 is a waveform diagram explanatory of the principles of operation of the circuit shown in FIG. 4. The abscissa represents time and the ordinate amplitude. The basic operation will be described with reference to FIGS. 2 and 4.

Now, let the analog input signal (1) to the subtractor 1 be represented by $X(nT)$. The output $Z(nT)$ from the subtractor 1 for the time-divided preceding bit is quantized by the quantizer 2 and is added by the adder 5 to provide a prediction signal $Y(nT)$, which is delayed by the delay element 6 for a delay time T corresponding to one bit, providing a signal $Y(nT-T)$. This signal is applied to the subtractor 1, wherein it and the current input $X(nT)$ are compared with and subtracted from each other. Thus, the output $Z(nT)$ of the subtractor 1 is given by the following equation:

$$Z(nT) = X(nT) - Y(nT-T).$$

The output $Z(nT)$ and a step width $\Delta(nT)$ which is obtained from the step width adjuster 4 are applied to the quantizer 2. The output $Q(nT)$ of the quantizer 2 and the output $B(nT)$ of the encoder 3 become as follows, depending on whether the output Z(nT) is plus or minus:

When Z(nT)≧0:

$Q(nT) = +\Delta(nT)$ and $B(nT) = 1$.

When Z(nT)<0:

$Q(nT) = -\Delta(nT)$ and $B(nT) = 0$.

The output B(nT) of the encoder 3 is applied to the step width adjuster 4 and its output step width Δ(nT) varies with the output B(nT) of the encoder 3.

That is, as shown in FIG. 2, the curve (1) and the stair step waveform Y(nT) are mutually compared for each time-divided bit of the analog speech waveform (1), so that this comparison takes place every delay time T, providing the digital signal (5) for transmission.

For obtaining an output close to the original waveform, it is necessary that the prediction signal Y(nT), which is the output from the adder 5, be of the same waveform as that of the decoded signal which is the output (7) of the decoder 23.

On the other hand, the digital input signal (6) to the decoder 23 is subjected to processing which is the exact reverse of that in the coder 22, by the decoder 10, the step width adjuster 9, the adder 11 and the delay element 12 to provide the analog output signal (7), i.e. Y(nT), reproducing the speech signal.

The output step width Δ(nT) of each of the step width adjusters 4 and 9 in the coder 22 and the decoder 23 becomes 1.4 fold when the sign of the input thereto remains unchanged, for example, for three to four bits, and when the sign of the input changes, the step width becomes 0.98 fold.

Now, a description will be given of problems of the conventional circuit based on the above-mentioned principles of operation.

Figure 3:
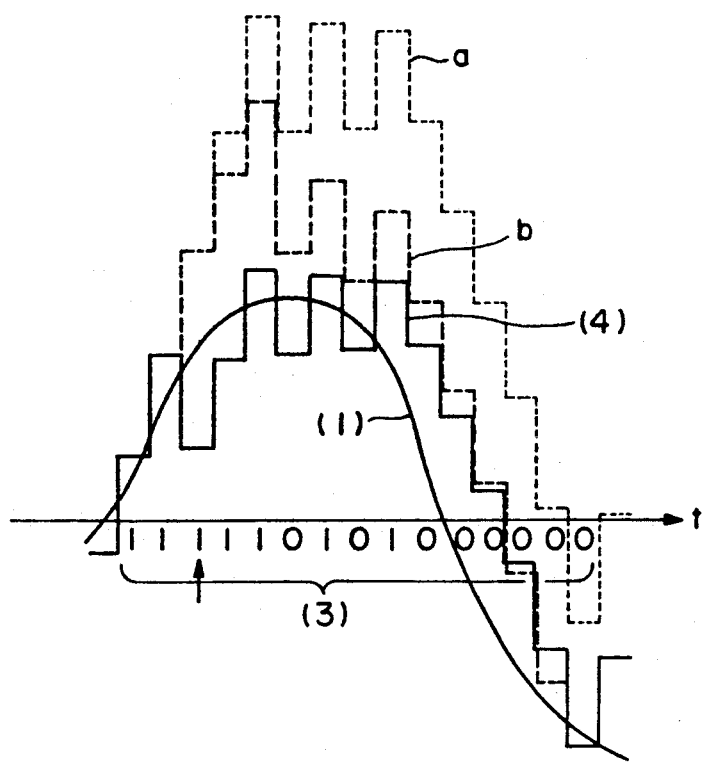
FIG. 3 is a waveform diagram explanatory of its operation.

FIG. 3 is a waveform diagram explanatory of the operations of the coder 22 and the decoder 23. The abscissa represents time t and ordinate amplitude. In FIG. 3, reference numeral (1) indicates an input speech signal and the stair step waveform indicated by (4) is the output waveform of the decoder 23 at the receiving side when the circuit and the transmission line are normal. Now, let it be assumed that the output digital signal for transmission, encoded from the input speech signal (1), is [11011010100 . . . ]. In a case where a coding error occurs in such a transmitted output digital signal during transmission owing to a bad condition of the transmission line and, as a result, its third bit changes from "0" to "1" as shown in the digital input signal (3) at the receiving side in FIG. 3, the amplitude corresponding to that bit increases in the decoder 23 and the output waveform (4) becomes as indicated by the waveform a, that is, the output waveform greatly differs from the original waveform. Consequently, when the digital input signal is converted into the analog speech signal, the speech quality is deteriorated.

Thus, the conventional circuit construction is defective in that when a coding error occurs during transmission on the transmission line between the transmitted and received data (5) and (6), an amplitude variation is incurred according to the state of generation of the error, and in a case where the coding error occurs which increases the amplitude of the output signal, that is, when the transmitted signal is erroneously changed from "0" to "1", the deterioration of the speech quality is particularly serious.

With reference to the accompanying drawings, the present invention will hereinafter be described in detail.

Figure 1:
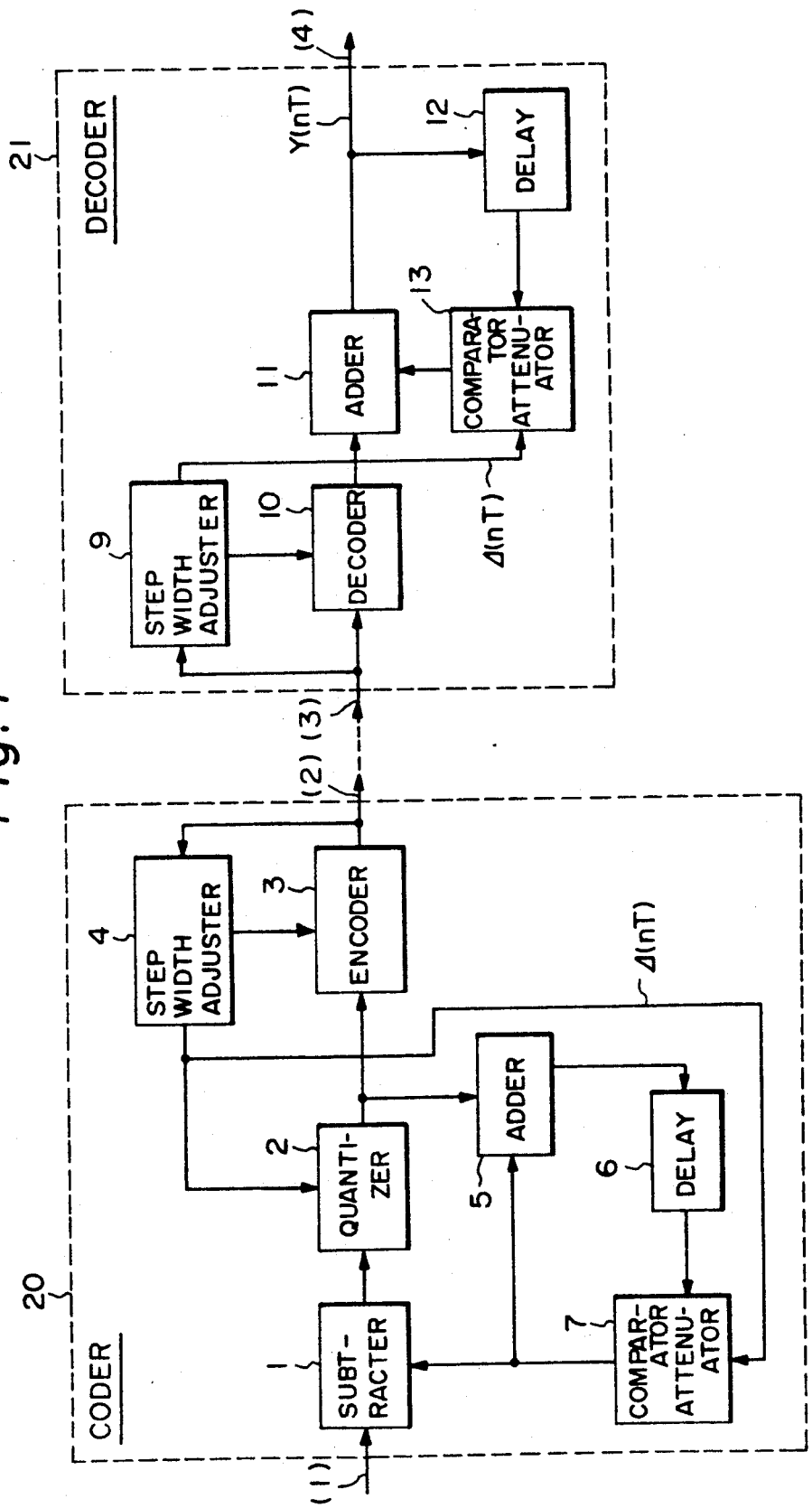
FIG. 1 is a block diagram illustrating the circuit construction of an embodiment of the present invention.

FIG. 1 illustrates in block form the circuit construction of an embodiment of the present invention. In FIG. 1, each of circuits 7 and 13 respectively provided in a coder 20 and a decoder 21 is a comparator/attenuator (LM) which constitutes the feature of the invention. The other circuits 1 to 6 in the coder 20 and circuits 9 to 12 in the decoder 21 are the same as those used in the prior art example depicted in FIG. 4.

Figure 5:
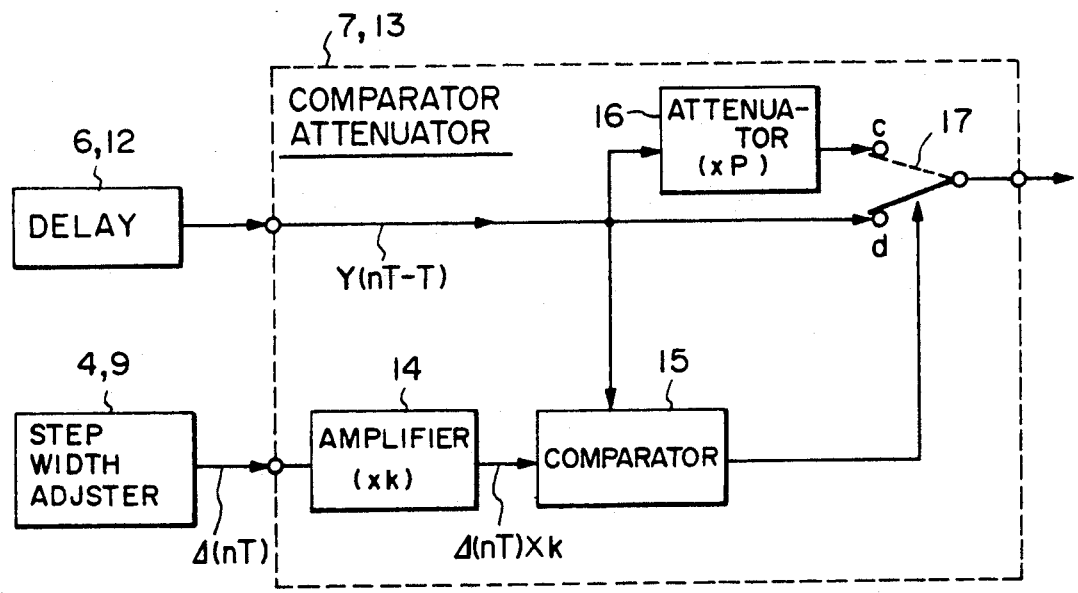
FIG. 5 is a block diagram illustrating an embodiment of a comparator/attenuator which constitutes the principle part of the present invention.

FIG. 5 is a block diagram illustrating a specific operative example of the comparator/attenuator 7 (13). Reference numeral 14 denotes an amplifier which makes the amplitude of an input signal k-fold, 15 a comparator which compares two input voltages with each other to generate only the higher one of them, 16 an attenuator and 17 a switch. The comparator/attenuator 7 or 13 receives at the one input terminal the output step width Δ(nT) of the step width adjuster 4 or 9, makes the voltage k-fold, compares, by the comparator 15, the voltage with the absolute value of the amplitude of the prediction signal (in the case of the coder) or the decoded signal (in the case of the decoder) Y(nT) input at the other terminal, and changes over the switch 17, effecting the following attenuation control:

When $|Y(nT)| \geq \Delta(nT) \times k$: the switch 17 is switched to a contact c to output $Y(nT) \times P$; and When $|Y(nT)| < \Delta(nT) \times k$: the switch 17 is switched to a contact d to output Y(nT) intact.

In the above, k is a coefficient which is set to an arbitrary value in the range of from 2 to 4, and P is a coefficient for attenuating Y(nT) and is set to a value smaller than 1, more specifically, in the range of $0.8 < P < 0.99$.

The above conditions are set in both of the comparator/attenuators 7 and 13 so that the prediction signal Y(nT), which is input into the comparator/attenuator 7 in the coder 20, and the decoded signal Y(nT), which is input into the comparator/attenuator 13 in the decoder 21, may be rendered to have the same waveform.

FIG. 3 shows mainly the positive portion of the waveform of the signal Y(nT). Its amplitude increases in response to the change of the code from the state "0" to "1" and when the signal Y(nT) exceeds a value of $\Delta(nT) \times k$, the comparator/attenuator 13 operates to attenuate the signal Y(nT) to a P-fold value. However, if a state "0" appears at the bit position where a state "1" ought to be, the comparator/attenuator 13 will not operate. It is apparent that the same results are also obtainable in the negative portion of the waveform, since the signal Y(nT) is controlled in terms of its absolute value.

Thus, the present invention produces the effect of attenuating the amplitude of the decoded signal which is increased in the positive- or negative-going direction by a coding error which occurs during transmission on the transmission line between the digital data output terminal (2) and the digital data input terminal (3).

In a case where the third bit of the received input data (3), which ought to be a state "0", goes to a state "1" owing to a coding error during transmission, the conventional circuit provides such a decoded waveform such as indicated by a in FIG. 3, whereas the circuit of the present invention provides such a decoded waveform as indicated by b. In this instance, the coefficients k and P were set to 3.0 and 0.9, respectively.

Thus, in a case where the coding error occurs in the direction so as to increase the amplitude of the received waveform in the positive- or negative-going portion thereof, the amplitude appreciably increases in the conventional circuit as seen from the waveform a, whereas the circuit of the present invention suppresses the increase in the amplitude as seen from the waveform b and provides a decoded waveform close to the original one.

When no coding error occurs, there is no influence of the comparator/attenuator 13.

As described above in detail, the use of the present invention affords reduction of fluctuations of a decoded waveform caused by a coding error on a transmission line of much noise, and when the invention is applied to a circuit in which the coding error is likely to occur during transmission as in land mobile communication, it is possible to implement a speech decoder which economical and does not seriously deteriorate the speech tone quality. Hence, the present invention is of great utility.

What we claim is:

1. A speech coder using an adaptive delta modulation coding system comprising:

input terminal means for receiving an analog input signal to be coded;

a subtracter receptive of the analog input signal for subtracting a prediction signal from the analog input signal to generate a subtracted output to be coded;

a quantizer receptive of the subtracted output for quantizing the subtracted output by use of a step width to generate a quantized output;

an encoder receptive of the quantized output for coding the quantized output by the use of the step width to generate a coded output applied to a transmission line;

a step width adjuster for generating the step width applied to the quantizer and to the encoder in accordance with the coded output;

an adder receptive of the quantized output for adding the quantized output to the prediction signal to generate an added output;

delay means receptive of the added output for delaying the added output by a sampling period in said quantizer to generate a delayed output;

an amplifier receptive of said step width and having an amplification factor k for amplifying the step width to generate a k-fold step width;

a comparator for comparing the delayed output with the k-fold step width to change from a false state to a true state of its control output when an absolute value of the delayed output exceeds the k-fold step width;

an attenuator receptive of the delayed output and having an attenuator factor p for attenuating the delayed output to generate a p-fold delayed output; and switch means for selecting the delayed output or the k-fold step width in correspondence, respectively, to the false state or the true state of the control output of the comparator to generate the prediction signal applied to the subtracter to generate the subtracted output.

2. A speech coder using an adaptive delta modulation coding system according to claim 1, in which k is a coefficient having a value in a range of 2 to 4.

3. A speech coder using an adaptive delta modulation coding system according to claim 1, in which p is a coefficient having a value in a range of 0.8 to 0.99.

4. A speech decoder using an adaptive delta modulation decoding system comprising:

input terminal means for receiving an analog coded input from a transmission line;

a step width adjuster receptive of the coded input for generating a step width in accordance with the coded input;

a decoder receptive of the coded input for decoding the coded input by the use of the step width to generate a decoded output;

an adder receptive of the decoded output for adding the decoded output to a prediction signal to generate a demodulated analog output;

delay means for delaying the demodulated analog output by a sampling period in said decoder to generate a delayed analog output;

an amplifier receptive of the step width and having an amplification factor k for amplifying the step width to generate a k-fold step width;

a comparator for comparing the delayed analog output with the k-fold step width to change from a false state to a true state of its output when an absolute value of the delayed analog output exceeds the k-fold step width;

an attenuator receptive of the delayed analog output and having an attenuator factor p for attenuating the delayed analog output to generate a p-fold delayed output; and switch means for selecting the delayed output or the k-fold step width in correspondence, respectively, to the false state or the true state of the control output of the comparator to generate the prediction signal.

5. A speech decoder using an adaptive delta modulation decoding system according to claim 4, in whick k is a coefficient having a value in a range of 2 to 4.

6. A speech decoder using an adaptive delta modulation decoding system according to claim 4, in which p is a coefficient having a value in a range of 0.8 to 0.99.

* * * * *